(12) United States Patent
Yagisawa

(10) Patent No.: US 8,228,686 B2
(45) Date of Patent: Jul. 24, 2012

(54) SUBSTRATE FOR HIGH FREQUENCY AND PACKAGE USING THIS SUBSTRATE

(75) Inventor: Takatoshi Yagisawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 223 days.

(21) Appl. No.: 12/636,698

(22) Filed: Dec. 11, 2009

(65) Prior Publication Data

US 2010/0177489 A1    Jul. 15, 2010

(30) Foreign Application Priority Data

Jan. 15, 2009    (JP) .................. 2009-006227

(51) Int. Cl.
*H05K 7/02* (2006.01)

(52) U.S. Cl. ...................................... 361/810

(58) Field of Classification Search .................. 361/810, 361/277, 278, 281, 283, 287, 292, 328, 760, 361/782, 792, 795
See application file for complete search history.

(56) References Cited

U.S. PATENT DOCUMENTS 7,046,100 B2    5/2006    Yagisawa

FOREIGN PATENT DOCUMENTS

| JP | 9-107210 A | 4/1997 |
|---|---|---|
| JP | 2005-303551 | 10/2005 |
| JP | 2008-125038 A | 5/2008 |

OTHER PUBLICATIONS

Machine Translation of Japanese Patent Publication No. 09-107210A, Apr. 22, 1997.*

* cited by examiner

*Primary Examiner* — Jeremy Norris
*Assistant Examiner* — Tremesha S Willis
(74) *Attorney, Agent, or Firm* — Fujitsu Patent Center

(57) ABSTRACT

A substrate for high frequency includes: a dielectric substrate; a transmission line which is formed on a front surface of the dielectric substrate and includes land portions opposite to each other with a gap therebetween; a grounded conductor which is formed on a rear surface of the dielectric substrate and includes an opening portion in a region corresponding to the land portions; and a metal substrate on which the dielectric substrate is disposed in a state where the grounded conductor is in contact with the metal substrate, and also, a through hole is formed at a portion corresponding to the opening portion.

13 Claims, 4 Drawing Sheets

RELATION OF W/S

SUBSTRATE FOR HIGH FREQUENCY AND PACKAGE USING THIS SUBSTRATE

CROSS-REFERENCE TO RELATED APPLICATION

This application is based upon and claims the benefit of priority of the prior Japanese Patent Application No. 2009-006227, filed on Jan. 15, 2009, the entire contents of which are incorporated herein by reference.

FIELD

The embodiment discussed herein is related to structures of a substrate provided with a transmission line for high frequency and of an IC package equipped with this substrate.

BACKGROUND

For example, in an optical transmitter and receiver provided in an optical transmission system transmittable a high-speed (broadband) optical signal of 40 Gb/s or the like, an electric signal for driving an optical modulator or the like which is provided in the optical transmitter and receiver is a high frequency signal in accordance with the high-speed optical signal. In some of devices processing such a high frequency signal, it is necessary to perform electric connection between the devices by blocking a DC (direct current) component while coupling AC (alternate current) components. In recent years, in response to a demand for device miniaturization, a DC block circuit for blocking the DC component tends to be incorporated in a package of the device.

The DC block (or DC cut) circuit incorporated in the package is provided as a substrate for high frequency on which a transmission line for transmitting and receiving the high frequency signal between an IC chip in the package and a circuit or the like outside the package is formed, and a chip condenser (chip capacitor) or the like is mounted on the transmission line. The transmission line is formed by patterning on a front surface of a dielectric substrate such as ceramics, and a grounded conductor is formed on a rear surface of the dielectric substrate, so that a microstrip line configuration is provided as one example. In the way of the transmission line formed on the front surface of the dielectric substrate, two land portions wider than the other portion opposite to each other with a gap therebetween are formed, and an electric component, such as the chip condenser, is mounted on the land portions so as to cross the gap. The grounded conductor formed on the rear surface of the dielectric substrate is in contact with a metal substrate provided as a housing of the package, for example. Namely, the dielectric substrate is disposed on the metal substrate in the state where the grounded conductor is in contact with the metal substrate.

The line width and the like of the transmission line for high frequency formed in the DC block circuit is designed in order to match with a predetermined characteristic impedance such as 50Ω. In recent years, since a bonding pad of the IC chip connected to the transmission line becomes narrow pitched, the transmission line is designed so that the predetermined characteristic impedance is obtained in the narrow line width corresponding to the narrow pitch. However, since the chip condenser or the like needs to be mounted on a DC blocking portion (the gap and the land portions) of the transmission line, the line width of the DC blocking portion needs to be widen for using as a connecting land corresponding to the chip condenser or the like. Accordingly, it is necessary to consider how a characteristic impedance of the land portions in which the line width is made wider, is made to match with the predetermined characteristic impedance such as 50Ω at the other portion than the land portions, and therefore, such a technique has been disclosed in Japanese Laid-open Patent Publication No. 09-107210 (to be referred to as "Patent Documents 1") and Japanese Laid-open Patent Publication No. 2008-125038 (to be referred to as "Patent Document 2").

According to the technique disclosed in each of Patent Documents 1 and 2, as to the land portions of the transmission line, line widths of which are made wide for mounting the electric component, the grounded conductor in a region where such land portions are projected onto the rear surface of the dielectric substrate, is eliminated from the dielectric substrate, so that an opening portion is formed on the land portions-corresponding region in the grounded conductor. Further, a concave portion (dug groove) is formed on the metal substrate (described as a metallic case or a metal base in Patent Documents) below the opening portion in the grounded conductor, and the depth of the concave portion is designed at a specific value, so that the characteristic impedance of the land portions of the transmission line positioned above the concave portion is matched with a target value.

As described above, in the structure in which the concave portion is disposed on the metal substrate so that a capacity to the ground of the land portions of the transmission line is regulated, the characteristic impedance is determined depending on the depth of the concave portion (refer to "h2", "D" described in Patent Documents), and thus, the concave portion needs to be processed with precision. However, since the processing of the concave portion on the metal substrate needs to be performed by mechanical process, the processing precision is not so high (tolerance of about ±50 μm). Accordingly, the technique disclosed in Patent Documents is not advantageous for the high frequency to be used in optical transmission speed of 40 Gb/s or higher. Further, if the position at which the concave portion is formed and the position of the opening portion in the grounded conductor do not accurately correspond to each other, the characteristic impedance is affected. Therefore, there is a problem to be solved in that the positioning of the opening portion relative to the concave portion needs to be performed with precision, namely, the disposing position of the dielectric substrate on the metal substrate needs to be performed with precision.

Focusing on the above-mentioned problem, the above substrate for high frequency needs to have a structure which makes the characteristic impedance matching much easier and is further suitable for high frequency than the conventional structure.

SUMMARY

According to an aspect of the invention, a substrate for high frequency includes: a dielectric substrate; a transmission line which is formed on a front surface of the dielectric substrate and includes land portions opposite to each other with a gap therebetween; a grounded conductor which is formed on a rear surface of the dielectric substrate and includes an opening portion in a land portions-corresponding region; and a metal substrate on which the dielectric substrate is disposed in a state where the grounded conductor is in contact with the metal substrate, having a through hole formed at a portion of the metal substrate corresponding to the opening portion.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
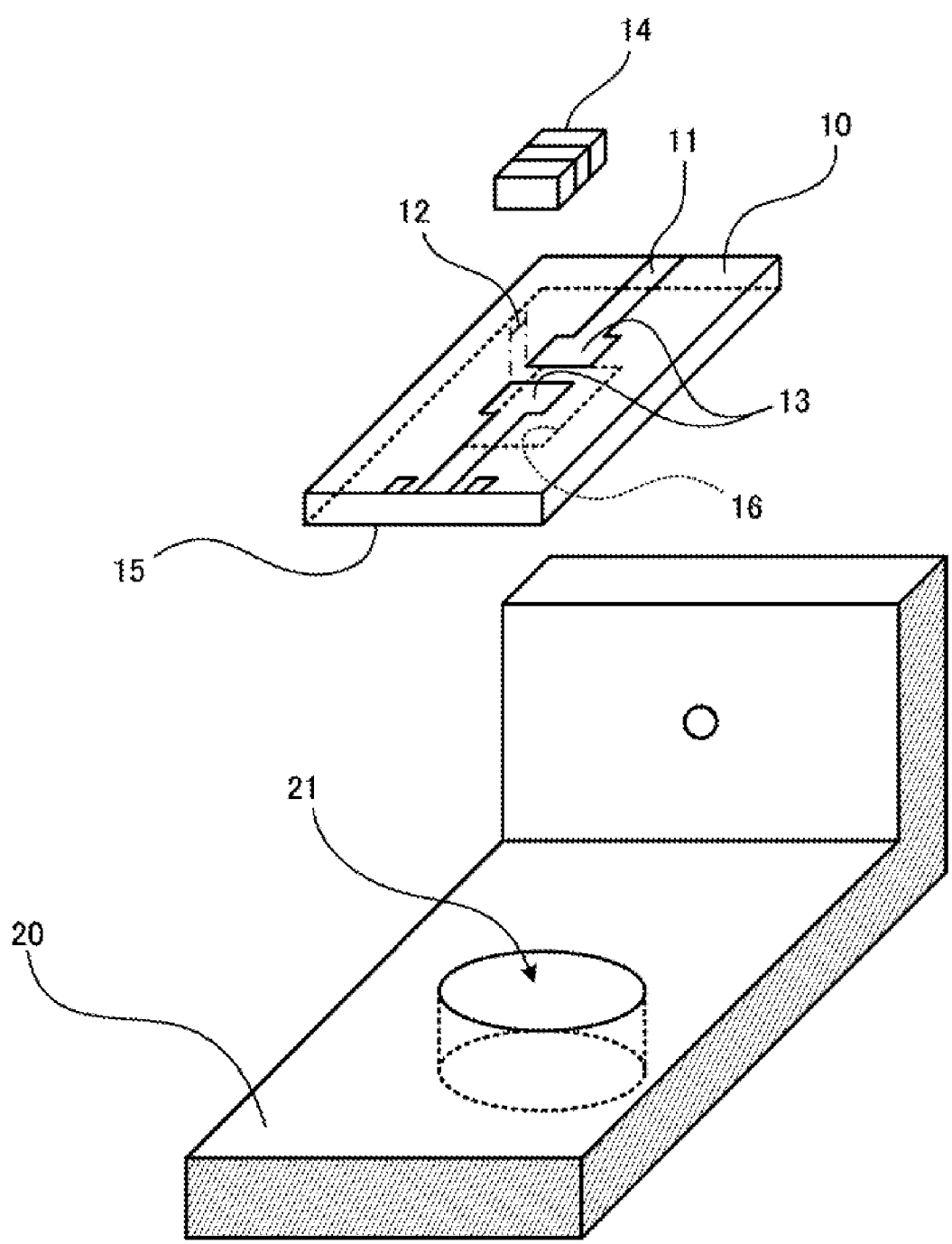
FIG. 1 is an exploded perspective view illustrating an embodiment of a substrate for high frequency.
Figure 2A:
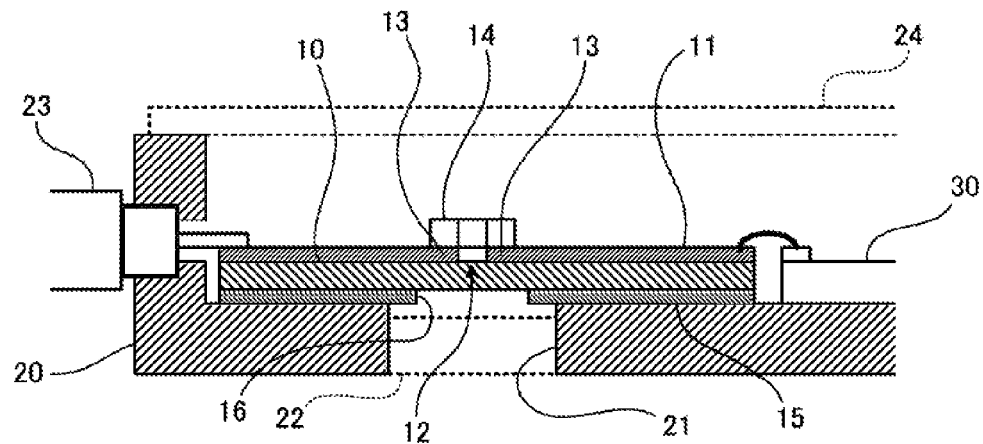
FIG. 2A is a cross sectional view illustrating the embodiment of the substrate for high frequency.

FIG. 1 and FIG. 2 illustrate an embodiment of a substrate for high frequency in which a DC block circuit is formed, as one example. Incidentally, in the following explanation, there will be described an example in which a chip condenser is mounted as an electric component, for DC blocking. However, the electric component is not limited to the chip condenser, and a resistor or the like other than the condenser is also included as the electric component.

The substrate for high frequency according to the present embodiment includes a dielectric substrate 10 such as ceramics, and a conductive metal substrate 20 which also serves as a housing of a package in this example. Incidentally, for the metal substrate 20, not the entirety thereof but an essential part thereof including a partial cross section is illustrated in the figure.

On a front surface (illustrated as an upper surface in the figure) of the dielectric substrate 10, a transmission line 11 is formed by utilizing a process of photolithography or the like. The transmission line 11 is formed by patterning in a shape in which land portions 13 opposite to each other with a gap 12 therebetween are included in the way of the transmission line 11. The land portions 13 are portions of the transmission line 11, of which line widths are wider than the remaining portion of the transmission line 11 other than the land portions 13, in order to mount a chip condenser 14 for DC blocking, as one example of electric component, on the land portions 13 by soldering or the like.

On an entire rear surface (illustrated as a lower surface in the figure) of the dielectric substrate 10, a ground conductor 15 is formed, and a microstrip line is configured up by the transmission line 11 on the front surface of the dielectric substrate 10 and the grounded conductor 15 on the rear surface thereof. On the grounded conductor 15, in a region corresponding to the land portions 13 of the transmission line 11, a rectangular opening portion 16 is formed, as one example. The opening portion 16 is formed to include at least a region where the land portions 13 are projected on the rear surface of the dielectric substrate 10. For example, the length of the opening portion 16 in a direction same as a longitudinal direction of the transmission line 11 is approximately same as the total length of the gap 12 and two land portions 13 in the transmission line 11, and the width of the opening portion 16 is equal to or wider than the line widths of the land portions 13, as described later. Incidentally, the opening portion 16 may be formed in another shape, such as, elliptical shape, hexagonal shape, rhombic shape or the like, provided that a relation of W/S described later is satisfied. The opening portion 16 may be separated into a plural part.

The grounded conductor 15 of the dielectric substrate 10 is fixed by soldering or the like, so as to be in contact with the metal substrate 20. The metal substrate 20 on which the dielectric substrate 10 is disposed includes a through hole 21 at a portion thereof corresponding to the opening portion 16 of the grounded conductor 15. The through hole 21 according to the present embodiment, which is circular in cross section as one example, is formed so that a diameter D thereof (refer to FIG. 2C) is larger than the opening portion 16 so as to surround the entirety of the opening portion 16 therein. The cylindrical through hole 21 is capable to be formed relatively in ease by mechanical process, and passes through from an inner surface (a substrate disposing surface) of the metal substrate 20 to an outer surface thereof. Accordingly, in the metal substrate 20, there is the air or the like in a portion corresponding to the opening portion 16 of the grounded conductor 15. Otherwise, as illustrated by a dotted line in FIG. 2A, it is possible to fill a wave absorber 22 into the through hole 21. By filling the wave absorber 22 into the through hole 21, deterioration of high frequency signal being propagated through the transmission line 11 can be suppressed.

The substrate for high frequency illustrated in FIG. 1 and FIG. 2 is used in an IC package which is used as a driver for driving a Mach-Zehnder LN (Lithium Niobate) optical modulator applied to an optical transmitter and receiver in an optical transmission system. In such an IC package, as illustrated in FIG. 2, the metal substrate 20 is used as a housing of the package, and, as a connector for connecting with a circuit or the like outside the package, for example, a coaxial line 23 for transmitting a drive signal of the LN optical modulator from a signal generator is connected to a side wall portion of the metal substrate 20. An external conductor of the coaxial line 23 is electrically connected to the metal substrate 20, and an internal conductor thereof is electrically connected to the transmission line 11. On the metal substrate 20 serving as the housing, the dielectric substrate 10 and an IC chip 30 electrically connected to the transmission line 11 of the dielectric substrate 10 by wire bonding are mounted, and the metal substrate 20 is hermetic sealed by a lid 24 made of metal or ceramics. Although the through hole 21 is disposed on the metal substrate 20, one end of the through hole 21 is closed by the dielectric substrate 10 of which the grounded conductor 15 is soldered with the metal substrate 20, and thus, the hermetic sealing state by the metal substrate 20 can be ensured. The IC chip 30 in this example is a semiconductor chip integrating a drive circuit for driving the LN optical modulator.

In the substrate for high frequency according to the present embodiment, the line width of the remaining portion of the transmission line 11 other than the land portions 13 is designed so that predetermined characteristic impedance (for example, 50Ω) is obtained. The transmission line 11 is connected to a bonding pad of the IC chip 30 by wire bonding, and thus, the remaining portion of the transmission line 11 other than the land portions 13 is formed to have the relatively narrow line width to correspond to a narrow pitch of the bonding pad. On the other hand, since each land portion 13 mounted with the chip condenser 14 is forced to have the broad line widths, characteristic impedance thereof is different from that of the remaining portion of the transmission line 11. Therefore, the opening portion 16 is disposed on the land portions 13-corresponding region in the grounded conductor 15, and also, the through hole 21 is disposed at the portion corresponding to the opening portion 16 in the metal substrate 20, so that the characteristic impedance of the land portions 13 positioned above the opening portion 16 and the through hole 21 is matched with the characteristic impedance of the remaining portion other than the land portions 13.

Since the through hole 21 is arranged for the opening portion 16 of the grounded conductor 15, the shape of the opening portion 16 (peripheral edge shape of the grounded conductor 15 around the opening portion 16) participates in the characteristic impedance matching of the land portions 13. Namely, the diameter D of the through hole 21 to be disposed to the metal substrate 20 may be larger than the opening portion 16, and thus, the characteristic impedance of the land portions 13 is regulated by the patterning of the grounded conductor 15 exposed into the through hole 21. The grounded conductor 15 can be formed by the patterning (photolithography) using etching or the like, similarly to the transmission line 11, and thus, can be formed in a desired shape with higher precision (tolerance of about ±10 μm) compared with a concave portion by mechanical process in a conventional technique.

Figure 2B:
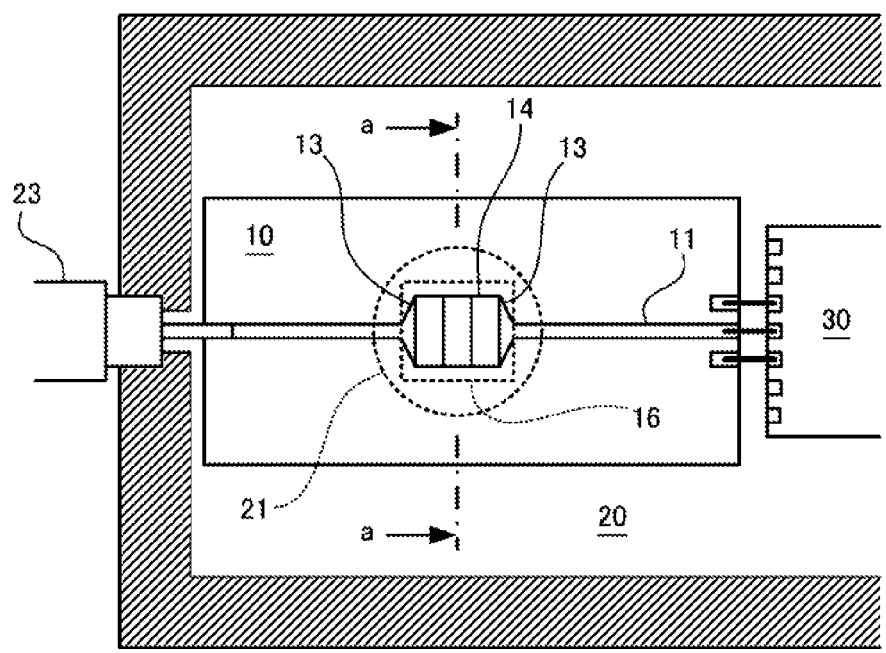
FIG. 2B is a plan view illustrating the embodiment of the substrate for high frequency.
Figure 2C:
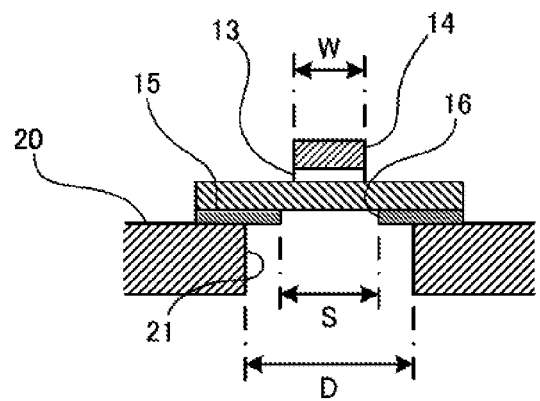
FIG. 2C is a cross sectional view illustrating the embodiment of the substrate for high frequency taken along the section line a-a of FIG. 2B.

The shape of the opening portion 16 to be formed by the patterning of the grounded conductor 15 is illustrated in FIG. 2C. FIG. 2C illustrates the shape of the land portion 13 in a line width direction thereof, taken along a-a line cross section of FIG. 2B.

Figure 3:
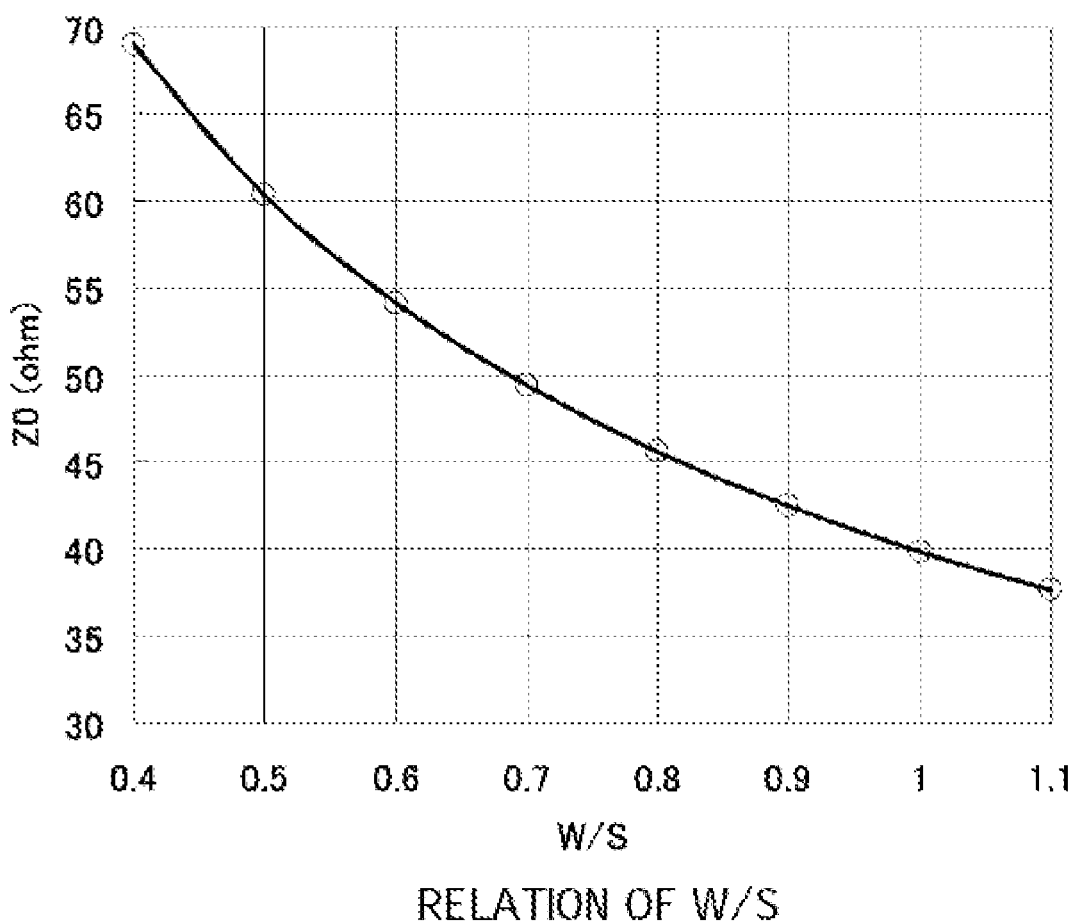
FIG. 3 is a graph illustrating a relation between the line widths W of land portions of a transmission line and the opening width S of an opening portion of a grounded conductor.

As illustrated in FIG. 2C, when the line width of each land portion 13 is W and the opening width of the opening portion 16 is S, a ratio W/S therebetween is used as a parameter. A simulation result of the ratio W/S is illustrated in FIG. 3. A graph in FIG. 3 illustrates a relation between the ratio W/S and the characteristic impedance Z0 of the land portions 13, in the dielectric substrate 10 of which relative permittivity Er=0 and of which thickness T=0.2 mm. The characteristic impedance Z0 of which target value is 50Ω may be in a range of ±20% relative to the target value. From the simulation result, it is verified that the characteristic impedance Z0 is in 40Ω to 60Ω when the ratio W/S is 0.5≦W/S≦1.

As compared to the above-mentioned shape of the opening portion 16, as to the through hole 21 to be disposed to the metal substrate 20, the opening portion 16 may merely be positioned in the through hole 21, and accordingly, the shape precision as in the concave portion in the conventional technique is not requested upon the through hole 21. Further, as illustrated in FIG. 2B, if the diameter D of the through hole 21 is widely formed so that the entire opening portion 16 easily enters the through hole 21, the high precision of the disposing position of the dielectric substrate 10 on the metal substrate 20 is not also requested.

Thus, in the substrate for high frequency according to the present embodiment, it is unnecessary to match the characteristic impedance based on the concave portion shape on the metal substrate 20 formed with low processing precision, and the characteristic impedance matching can be performed based on the opening shape of the grounded conductor 15 formed with high processing precision. Further, the opening portion 16 of the grounded conductor 15 may merely be positioned above the through hole 21 of the metal substrate 20, and thus, the precision of the disposing position of the dielectric substrate 10 on the metal substrate 20, as in the conventional technique is also unnecessary. Accordingly, it is possible to provide the substrate, which facilitates the characteristic impedance matching compared with the conventional technique and is further suitable for high frequency.

Figure 4:
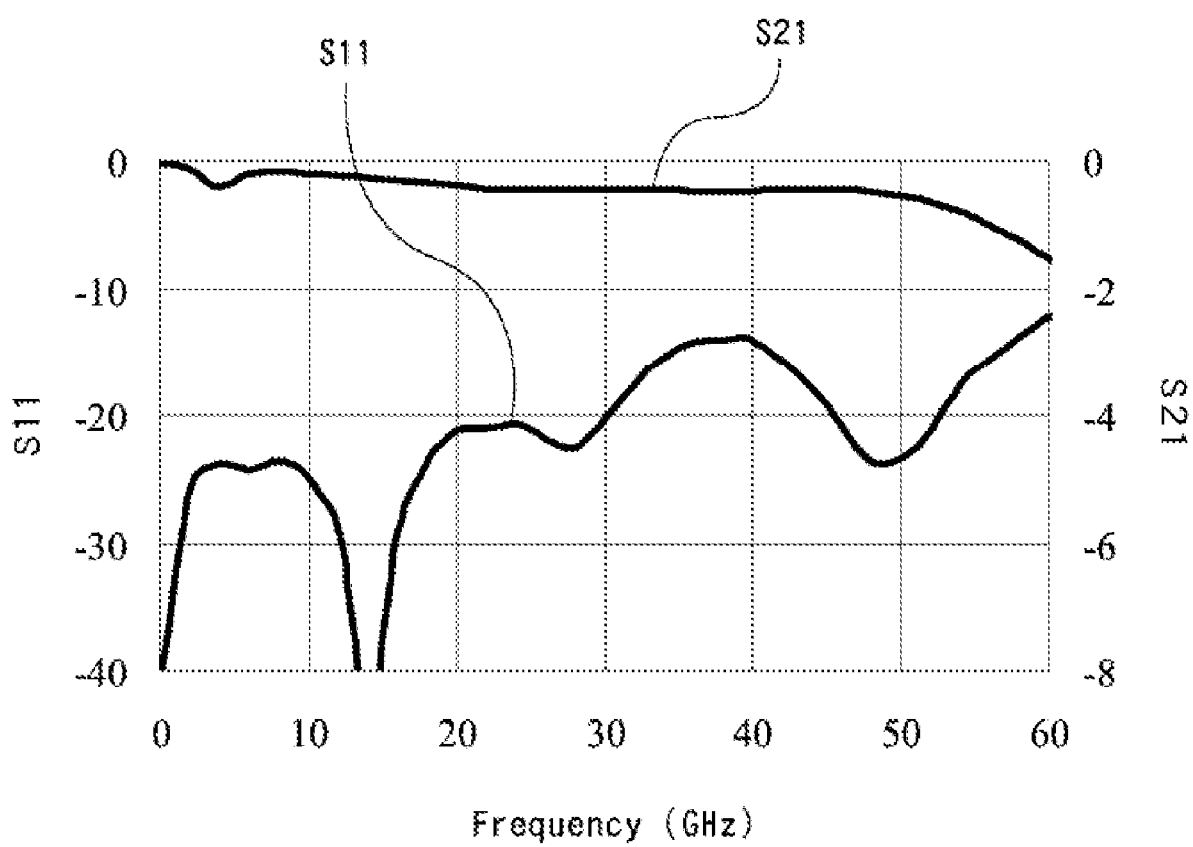
FIG. 4 is a graph illustrating TEG measurement results for S11 and S21 characteristics, related to the embodiment of the substrate for high frequency.

FIG. 4 illustrates TEG (Test Element Group) actual measurement results. A characteristic evaluation device of a structure illustrated in FIG. 2C is prepared, and S11 and S12 as S parameters thereof are measured. As illustrated in FIG. 4, it is understood that both of reflection characteristics of S11 and transmission characteristics of S21 are excellent up to a high frequency region exceeding 40 GHz, and 3 dB band of transmission characteristics is equal to or higher than 60 GHz.

As described in the above, according to the substrate for high frequency of the present embodiment, the through hole of the metal substrate is arranged for the opening portion of the grounded conductor, and thus, the opening shape of the grounded conductor (the peripheral edge shape of the grounded conductor around the opening portion) participates in the characteristic impedance matching of the land portions of the transmission line. Namely, the through hole disposed to the metal substrate may be wider than the opening portion, in other words, the through hole may be formed to have the size in which the opening portion is surrounded, and the characteristic impedance of the land portions is regulated by the pattern of the grounded conductor exposed into the through hole. The grounded conductor can be formed by the patterning using etching or the like, similarly to the transmission line, and thus, can be formed in a desired shape with high precision. On the other hand, the shape precision of the through hole of the metal substrate, such as the depth of the concave portion or the like in the conventional technique, is unnecessary, since the opening portion of the grounded conductor may merely be positioned in the through hole. Further, it is unnecessary to arrange the opening portion of the grounded conductor and the through hole of the metal substrate to be precisely coincident with each other, and the opening portion may be positioned inside the widely formed through hole. Therefore, the high precision of the disposing position of the dielectric substance on the metal substrate is also unnecessary.

As described in the above, in the substrate for high frequency proposed herein, it is unnecessary to match the characteristic impedance based on the concave portion shape of the metal substrate formed with low processing precision, and the characteristic impedance can be matched based on the opening shape of the grounded conductor formed with high processing precision. Further, since the opening portion of the grounded conductor may merely be positioned above the through hole of the metal substrate, the precision of the disposing position of the dielectric substrate on the metal substrate is also unnecessary, differently from the conventional technique. Consequently, the characteristic impedance matching can be easily performed compared with the conventional technique, and accordingly, it is possible to provide the substrate suitable for high frequency.

All examples and conditional language recited herein are intended for pedagogical purposes to aid the reader in understanding the invention and the concepts contributed by the inventor for furthering the art, and are to be construed as being without limitation to such specifically recited examples and conditions, nor does the organization of such examples in the specification relate to a showing of the superiority and inferiority of the invention. Although the embodiments of this invention have been described in detail, it should be understood that the various changes, substitutions, and alterations could be made hereto without departing from the spirit and scope of hthe invention.

What is claimed is:

1. A substrate for high frequency comprising:
   a dielectric substrate;
   a transmission line which is formed on a front surface of the dielectric substrate and includes land portions opposite to each other with a gap therebetween;
   a grounded conductor which is formed on a rear surface of the dielectric substrate and includes an opening portion in a region corresponding to the land portions; and
   a metal substrate on which the dielectric substrate is disposed in a state where the grounded conductor is in contact with the metal substrate, and which has a through hole formed at a portion of the metal substrate corresponding to the opening portion, in which the through hole passes through from an inner surface of the metal substrate to an outer surface thereof.

2. A substrate for high frequency according to claim 1, wherein when the opening width of the opening portion is S and the line width of each land portion is W, W/S is in a relation of $0.5 \leq W/S \leq 1$.

3. A substrate for high frequency according to claim 1, wherein the through hole has a circular cross-section diameter, into which the entire opening portion enters.

4. A substrate for high frequency according to claim 1, wherein a wave absorber is filled into the through hole.

5. A substrate for high frequency according to claim 1, wherein an electric component is mounted on the land portions.

6. A substrate for high frequency according to claim 5, wherein the electric component is a condenser.

7. A package equipped with a substrate for high frequency comprising:
   a dielectric substrate;
   a transmission line which is formed on a front surface of the dielectric substrate and includes land portions opposite to each other with a gap therebetween;
   a grounded conductor which is formed on a rear surface of the dielectric substrate and includes an opening portion in a region corresponding to the land portions; and
   a metal substrate on which the dielectric substrate is loaded in a state in which the grounded conductor is in contact with the metal substrate, and which has a through hole formed at a portion of the metal substrate corresponding to the opening portion, in which the through hole passes through from an inner surface of the metal substrate to an outer surface thereof,
   wherein an electric component is mounted on the land portions, and
   the metal substrate serves as a housing.

8. A package according to claim 7, wherein an IC chip electrically connected to the transmission line is mounted on the metal substrate serving as the housing, and the IC chip is sealed by the housing and the dielectric substrate.

9. A package according to claim 8, wherein the IC chip is the one in which a drive circuit for driving an optical modulator is integrated.

10. A package according to claim 7, wherein the electric component is a condenser.

11. A package according to claim 7, wherein when the opening width of the opening portion is S and the line width of each land portion is W, W/S is in a relation of $0.5 \leq W/S \leq 1$.

12. A package according to claim 7, wherein the through hole has a circular cross-section diameter, into which the entire opening portion enters.

13. A package according to claim 7, wherein a wave absorber is filled into the through hole.

* * * * *